(12) United States Patent
Tomita

(10) Patent No.: US 8,723,574 B2
(45) Date of Patent: May 13, 2014

(54) SEMICONDUCTOR INTEGRATED CIRCUIT

(75) Inventor: Yoshihiro Tomita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/363,832

(22) Filed: Feb. 1, 2012

(65) Prior Publication Data

US 2012/0286837 A1 Nov. 15, 2012

(30) Foreign Application Priority Data

May 12, 2011 (JP) ................. 2011-107181

(51) Int. Cl.
*H03K 3/289* (2006.01)

(52) U.S. Cl.
USPC ............. 327/202; 327/208; 327/218

(58) Field of Classification Search
USPC .......... 327/202, 203, 208, 210–212, 215, 218
See application file for complete search history.

(56) References Cited

U.S. PATENT DOCUMENTS

2007/0103217 A1* 5/2007 Frederick et al. .............. 327/218
2010/0221919 A1* 9/2010 Lee et al. ...................... 438/694

FOREIGN PATENT DOCUMENTS

| JP | 2004-241529 | 8/2004 |
| JP | 2005-286053 | 10/2005 |
| JP | 2007-221095 | 8/2007 |

* cited by examiner

*Primary Examiner* — Long Nguyen
(74) *Attorney, Agent, or Firm* — Oblon, Spivak, McClelland, Maier & Neustadt, L.L.P.

(57) ABSTRACT

According to one embodiment, a semiconductor integrated circuit is provided, which has mounted thereto a flip-flop circuit including a latch portion that takes and holds input data based upon a clock signal, and a clock portion that inputs the clock signal to the latch portion, wherein an active region of the flip-flop circuit is divided in such a manner that the width of the active region is secured, and each of the active regions has uniform width.

20 Claims, 11 Drawing Sheets

US 8,723,574 B2

SEMICONDUCTOR INTEGRATED CIRCUIT

CROSS-REFERENCE TO RELATED APPLICATIONS

This application is based upon and claims the benefit of priority from Japanese Patent Application No. 2011-107181, filed on May 12, 2011; the entire contents of which are incorporated herein by reference.

FIELD

Embodiments described herein relate generally to a semiconductor integrated circuit.

BACKGROUND

In a conventional flip-flop layout, an active region of a latch circuit and an active region of an inverter are continuously arranged, and gate electrodes to which a same signal is inputted are connected to one another by extending polycrystalline silicon. In order to avoid the polycrystalline silicon used for the extension described above, irregularities are produced on a layout in the active region of the flip-flop, and variation in characteristic due to a semiconductor manufacturing process is caused with microfabrication of a transistor.

The irregularities on the layout of the active region generate stress caused by the active region and the polycrystalline silicon arranged thereon, which causes a variation in timing in delay, set-up, and hold of the flip-flop.

DETAILED DESCRIPTION

In general, according to one embodiment, a semiconductor integrated circuit includes a flip-flop circuit provided with a latch portion configured to take and hold input data based upon a clock signal, and a clock portion configured to input the clock signal to the latch portion. In this flip-flop circuit, an active region of the flip-flop is divided so as to have an equal width.

Exemplary embodiments of the semiconductor integrated circuit will be explained below in detail with reference to the accompanying drawings. The present invention is not limited to the following embodiments.

(First Embodiment)

Figure 1:
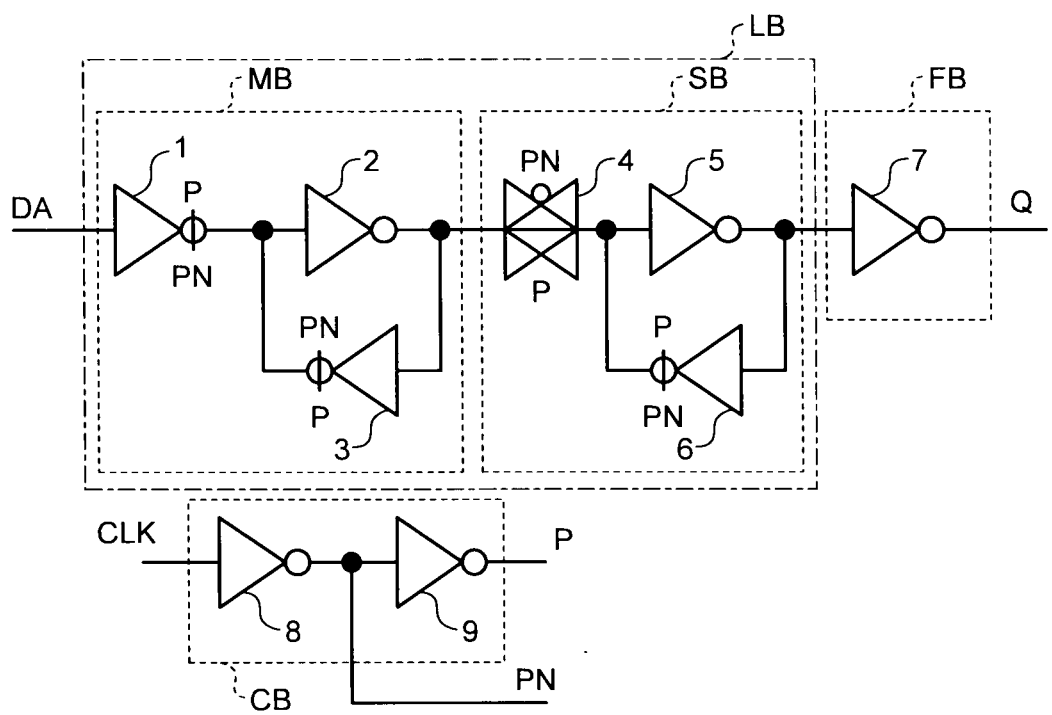
FIG. 1 is a block diagram illustrating a schematic structure of a semiconductor integrated circuit according to a first embodiment.
Figure 2:
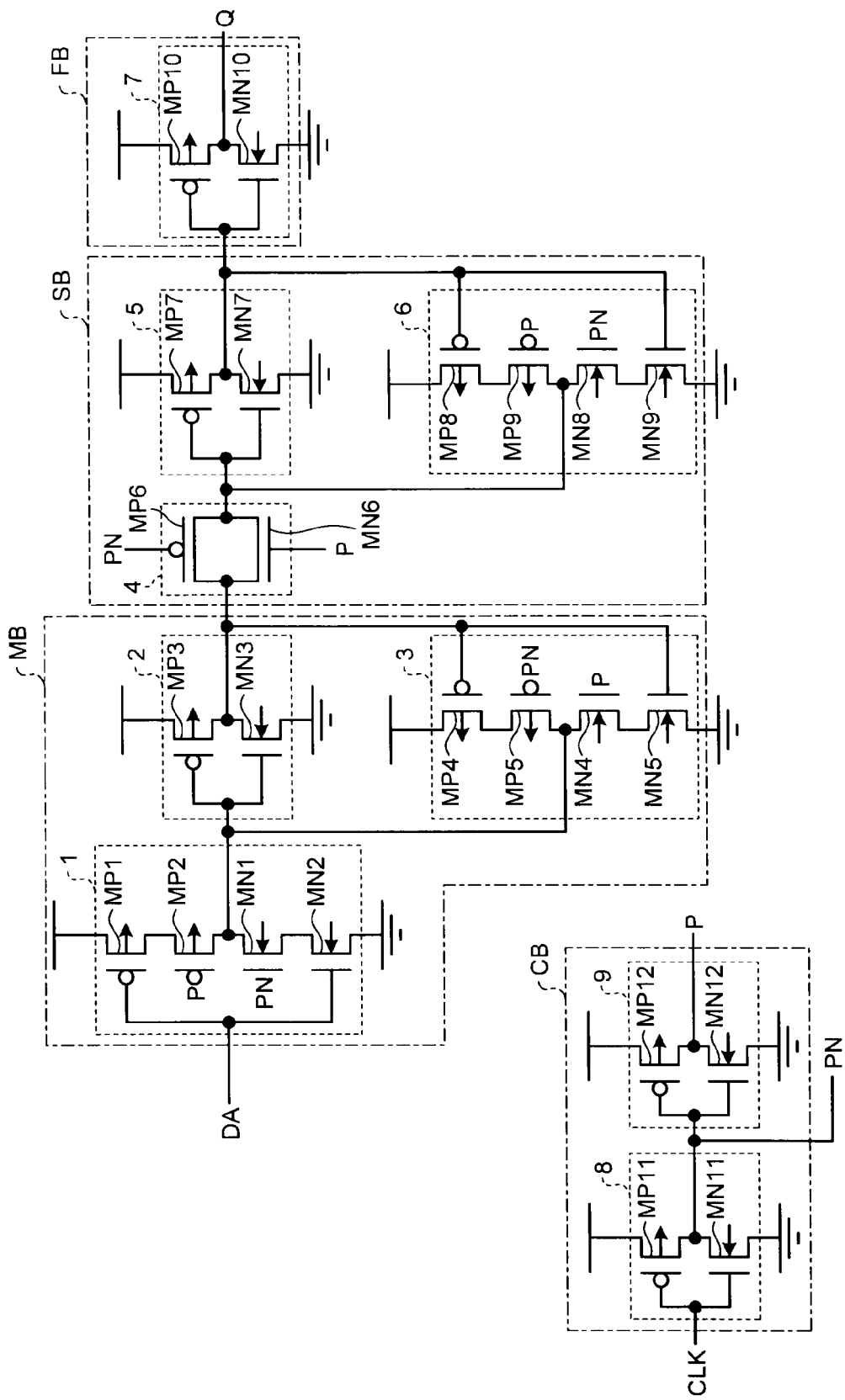
FIG. 2 is a view illustrating a circuit structure of the semiconductor integrated circuit in FIG. 1.

FIG. 1 is a block diagram illustrating a schematic structure of a semiconductor integrated circuit according to a first embodiment, and FIG. 2 is a view illustrating a circuit structure of the semiconductor integrated circuit in FIG. 1.

In FIG. 1, the semiconductor integrated circuit includes a latch portion LB that takes and holds input data DA based upon clock signals P and PN; a clock portion CB that inputs the clock signals P and PN to the latch portion LB; and a buffer portion FB that outputs output data Q based upon the input data DA held in the latch portion LB.

The latch portion LB includes a master portion MB that holds the input data DA, which is taken in a current process, with the input data DA that is taken in the previous process being held in a slave portion SB, and the slave portion SB that takes and holds the input data DA that is held in the master portion MB in the current process.

The master portion MB includes clocked inverters 1 and 3, and an inverter 2. The slave portion SB includes a transfer gate 4, a clocked inverter 6, and an inverter 5. The buffer portion FB includes an inverter 7. The clock portion CB includes inverters 8 and 9.

The clocked inverter 1, the inverter 2, the transfer gate 4, and the inverters 5 and 7 are sequentially connected in series. An input terminal of the inverter 2 is connected to an output terminal of the clocked inverter 3, while an input terminal of the clocked inverter 3 is connected to an output terminal of the inverter 2. An input terminal of the inverter 5 is connected to an output terminal of the clocked inverter 6, while an input terminal of the clocked inverter 6 is connected to an output terminal of the inverter 5.

The clock signals P and PN are inputted to clock terminals of the clocked inverters 1, 3, and 6 and the transfer gate 4. The input data DA is inputted to the input terminal of the clocked inverter 1, and the output data Q is outputted from the output terminal of the inverter 7.

The inverters 8 and 9 are connected in series. A clock signal CLK is inputted to the input terminal of the inverter 8, the clock signal P is outputted from the output terminal of the inverter 9, and the clock signal PN is outputted from the output terminal of the inverter 8.

The clock signal CLK is inverted in the inverter 8 so as to produce the clock signal PN, while the clock signal CLK is inverted twice in the inverters 8 and 9 so as to produce the clock signal P.

When the clock signal CLK goes low, the clock signal P goes low, and the clock signal PN goes high. In this case, the clocked inverters 1 and 6 are turned on, and the clocked inverter 3 and the transfer gate 4 are turned off. Therefore, the input data DA is taken in the master portion MB via the clocked inverter 1, while the output from the inverter 5 is inverted in the clocked inverter 6, and then, returned to the input of the inverter 5, whereby the input data DA that is taken from the master portion MB in the previous process is held in the slave portion SB.

When the clock signal CLK goes high, the clock signal P goes high, and the clock signal PN goes low. In this case, the clocked inverters 1 and 6 are turned off, and the clocked inverter 3 and the transfer gate 4 are turned on. Therefore, the output from the inverter 2 is inverted in the clocked inverter 3, and then, returned to the input of the inverter 2, resulting in that the input data DA taken in a current process is held in the master portion MB, and is taken into the slave portion SB via the transfer gate 4.

FIG. 2 is a view illustrating a circuit structure of the semiconductor integrated circuit in FIG. 1.

In FIG. 2, the clocked inverter 1 includes P-channel field-effect transistors MP1 and MP2, and N-channel field effect-transistors MN1 and MN2. The inverter 2 includes a P-channel field-effect transistor MP3 and an N-channel field-effect transistor MN3. The clocked inverter 3 includes P-channel field-effect transistors MP4 and MP5, and N-channel field-effect transistors MN4 and MN5. The transfer gate 4 includes a P-channel field-effect transistor MP6 and an N-channel field-effect transistor MN6. The inverter 5 includes a P-channel field-effect transistor MP7 and an N-channel field-effect transistor MN7. The clocked inverter 6 includes P-channel field-effect transistors MP8 and MP9, and N-channel field-effect transistors MN8 and MN9. The inverter 7 includes a P-channel field-effect transistor MP10 and an N-channel field-effect transistor MN10. The inverter 8 includes a P-channel field-effect transistor MP11 and an N-channel field-effect transistor MN11. The inverter 9 includes a P-channel field-effect transistor MP12 and an N-channel field-effect transistor MN12.

The P-channel field-effect transistors MP1 and MN2 and N-channel field-effect transistors MN1 and MN2 are connected in series. The P-channel field-effect transistor MP3 and the N-channel field-effect transistor MN3 are connected in series. The P-channel field-effect transistors MP4 and MN5 and N-channel field-effect transistors MN4 and MN5 are connected in series. The P-channel field-effect transistor MP6 and the N-channel field-effect transistor MN6 are connected in parallel. The P-channel field-effect transistor MP7 and the N-channel field-effect transistor MN7 are connected in series. The P-channel field-effect transistors MP8 and MP9 and N-channel field-effect transistors MN8 and MN9 are connected in series. The P-channel field-effect transistor MP10 and the N-channel field-effect transistor MN10 are connected in series. The P-channel field-effect transistor MP11 and the N-channel field-effect transistor MN11 are connected in series. The P-channel field-effect transistor MP12 and the N-channel field-effect transistor MN12 are connected in series.

A connection point between the P-channel field-effect transistor MP2 and the N-channel field-effect transistor MN1 is connected to a gate of the P-channel field-effect transistor MP3 and a gate of the N-channel field-effect transistor MN3. A connection point between the P-channel field-effect transistor MP3 and the N-channel field-effect transistor MN3 is connected to one of connection points of the P-channel field-effect transistor MP6 and the N-channel field-effect transistor MN6. The other connection point between the P-channel field-effect transistor MP6 and the N-channel field-effect transistor MN6 is connected to a gate of the P-channel field-effect transistor MP7 and a gate of the N-channel field-effect transistor MN7. A connection point between the P-channel field-effect transistor MP7 and the N-channel field-effect transistor MN7 is connected to a gate of the P-channel field-effect transistor MP10 and a gate of the N-channel field-effect transistor MN10.

A connection point between the P-channel field-effect transistor MP3 and the N-channel field-effect transistor MN3 is connected to a gate of the P-channel field-effect transistor MP4 and a gate of the N-channel field-effect transistor MN5. A connection point between the P-channel field-effect transistor MP5 and the N-channel field-effect transistor MN4 is connected to the gate of the P-channel field-effect transistor MP3 and the gate of the N-channel field-effect transistor MN3.

A connection point between the P-channel field-effect transistor MP7 and the N-channel field-effect transistor MN7 is connected to a gate of the P-channel field-effect transistor MP8 and a gate of the N-channel field-effect transistor MN9. A connection point between the P-channel field-effect transistor MP9 and the N-channel field-effect transistor MN8 is connected to the gate of the P-channel field-effect transistor MP7 and the gate of the N-channel field-effect transistor MN7. A connection point between the P-channel field-effect transistor MP11 and the N-channel field-effect transistor MN11 is connected to a gate of the P-channel field-effect transistor MP12 and a gate of the N-channel field-effect transistor MN12.

The input data DA is inputted to a gate of the P-channel field-effect transistor MP1 and a gate of the N-channel field-effect transistor MN2. The clock signal CLK is inputted to a gate of the P-channel field-effect transistor MP11 and a gate of the N-channel field-effect transistor MN11. The clock signal P is inputted to gates of the P-channel field-effect transistors MP2 and MP9 and gates of the N-channel field-effect transistors MN4 and MN6. The clock signal PN is inputted to the gates of the P-channel field-effect transistors MP5 and MP6 and the gates of the N-channel field-effect transistors MN1 and MN8.

When the clock signal CLK goes low, the clock signal P goes low, and the clock signal PN goes high. In this case, when the P-channel field-effect transistors MP2 and MP9 and the N-channel field-effect transistors MN1 and MN8 are turned on, the clocked inverters 1 and 6 are turned on. When the P-channel field-effect transistors MP5 and MP6 and the N-channel field-effect transistors MN4 and MN6 are turned off, the clocked inverter 3 and the transfer gate 4 are turned off. Therefore, the input data DA is taken in the master portion MB via the clocked inverter 1, and the output from the inverter 5 is inverted in the clocked inverter 6, and then, returned to the input of the inverter 5, whereby the input data DA taken from the master portion MB in the previous process is held in the slave portion SB.

When the clock signal CLK goes high, the clock signal P goes high, and the clock signal PN goes low. In this case, when the P-channel field-effect transistors MP2 and MP9 and the N-channel field-effect transistors MN1 and MN8 are turned off, the clocked inverters 1 and 6 are turned off. When the P-channel field-effect transistors MP5 and MP6 and the N-channel field-effect transistors MN4 and MN6 are turned on, the clocked inverter 3 and the transfer gate 4 are turned on. Therefore, the output from the inverter 2 is inverted in the clocked inverter 3, and then, returned to the input of the inverter 2, whereby the input data DA taken in a current process is held in the master portion MB, and taken into the slave portion SB via the transfer gate 4.

Figure 3:
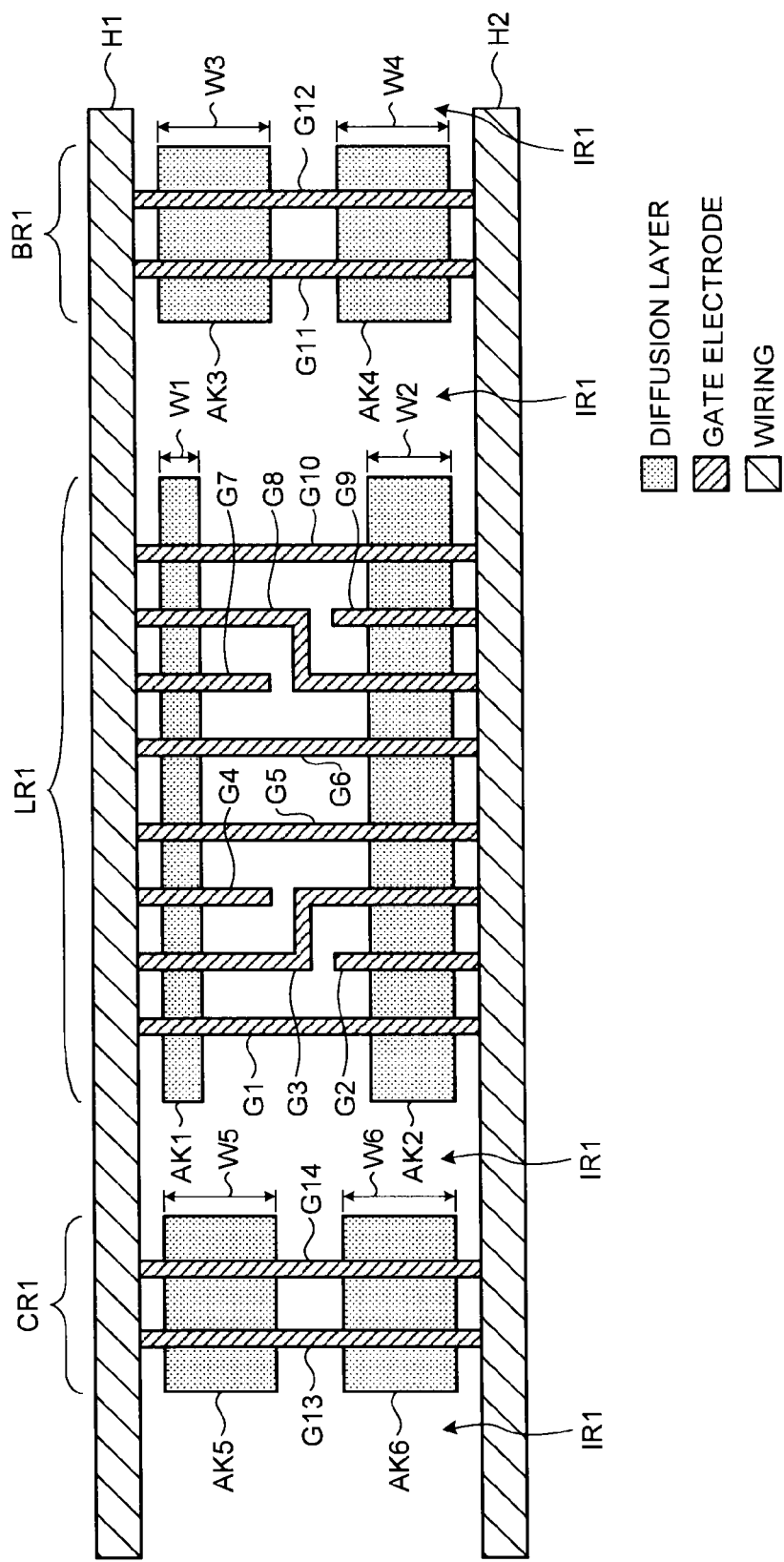
FIG. 3 is a plan view illustrating a layout structure of gate electrodes and active regions of the semiconductor integrated circuit in FIG. 1.
Figure 4:
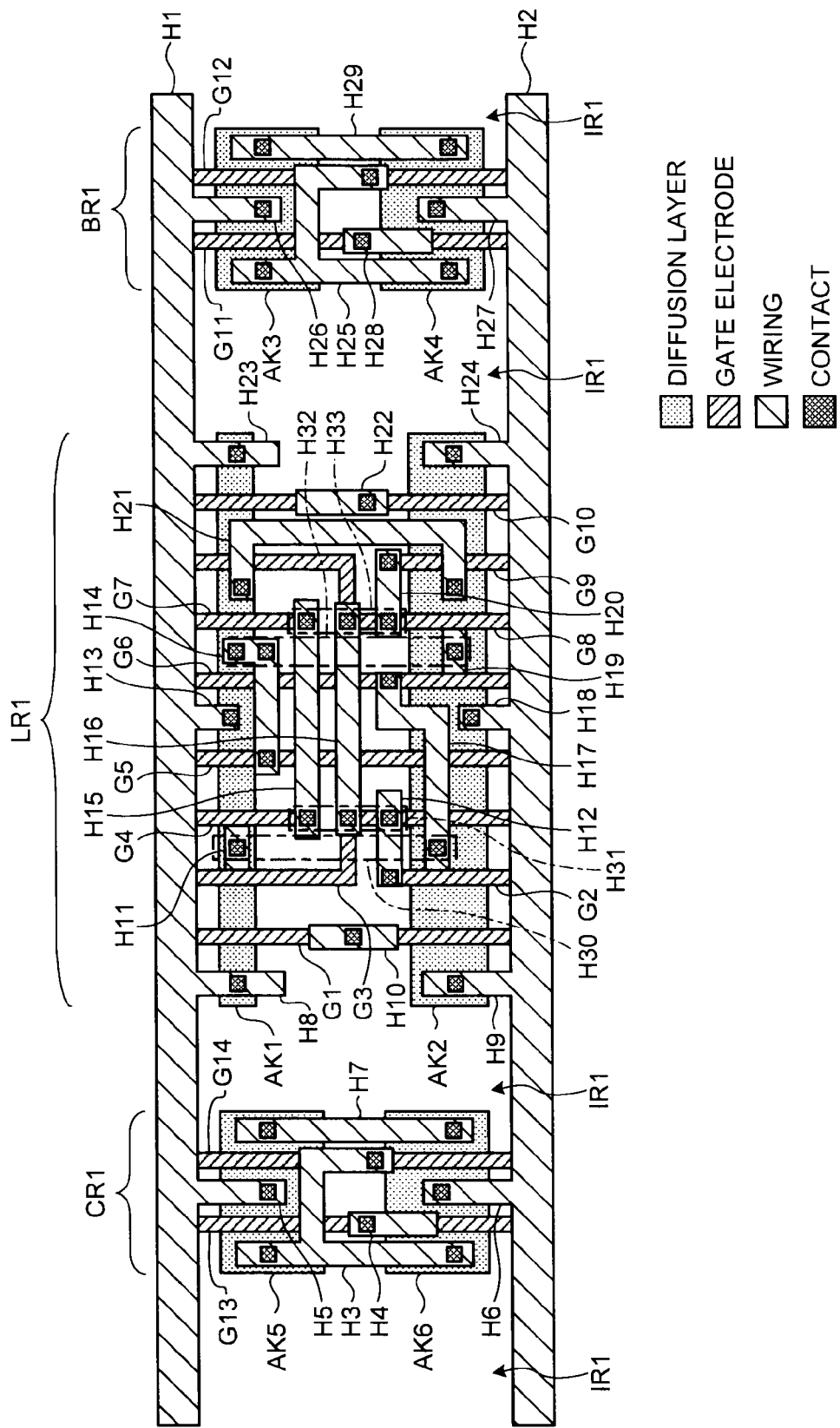
FIG. 4 is a plan view illustrating a layout structure when wirings are added to a latch portion in the semiconductor integrated circuit in FIG. 3.

FIG. 3 is a plan view illustrating a layout structure of gate electrodes and active regions of the semiconductor integrated circuit in FIG. 1; FIG. 4 is a plan view illustrating a layout structure when wirings are added to a latch portion in the semiconductor integrated circuit in FIG. 3; and FIG. 5 is a plan view illustrating a layout structure when wirings are added among the latch portion, a clock portion, and a buffer portion in the semiconductor integrated circuit in FIG. 4.

Figure 5:
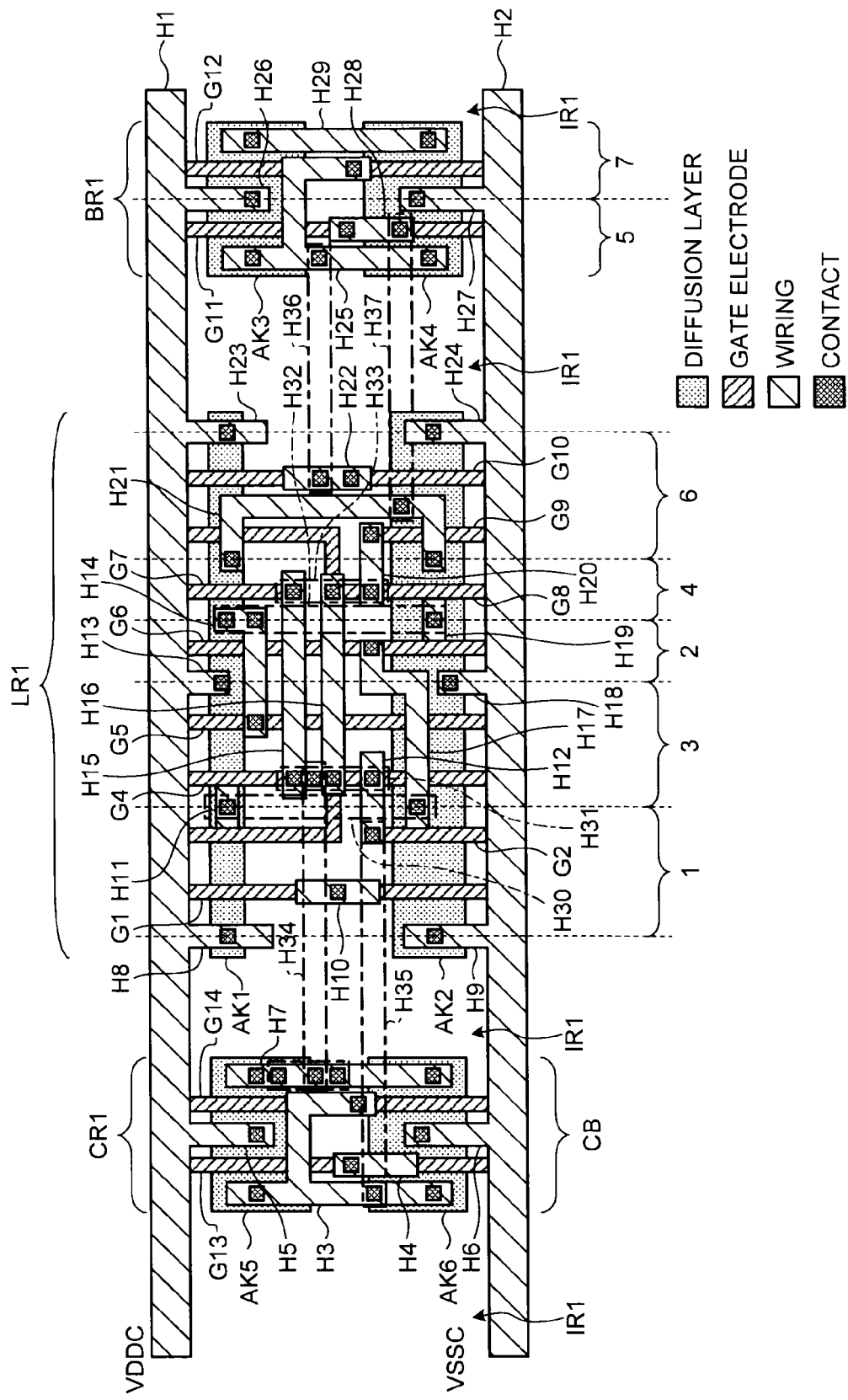
FIG. 5 is a plan view illustrating a layout structure when wirings are added among the latch portion, a clock portion, and a buffer portion in the semiconductor integrated circuit in FIG. 4.

In FIGS. 3 to 5, a clock region CR1, a latch region LR1, and a buffer region BR1 are provided on a semiconductor chip. The inverters 8 and 9 in FIG. 2 are mounted on the clock region CR1. The clocked inverters 1, 3, and 6, the transfer gate 4 and the inverter 2 in FIG. 2 are mounted on the latch region LR1. The inverters 5 and 7 in FIG. 2 are mounted on the buffer region BR1.

Specifically, active regions AK5 and AK6 are formed on the clock region CR1, active regions AK1 and AK2 are formed on the latch region LR1, and active regions AK3 and AK4 are formed on the buffer region BR1. The active regions AK1 to AK6 are isolated from one another via a device isolation region IR1. The active regions AK1 to AK6 are separated in such a manner that each of widths W1 to W6 of each of the active regions AK1 to AK6 is uniform in the respective regions. The active region here means a diffusion layer and a channel region. The diffusion layer can form a source and a drain of the field-effect transistor. The gate of the field-effect transistor can be formed by arranging the gate electrode on the channel region. The widths W1 to W6 of the active regions AK1 to AK6 respectively correspond to the widths of the gates on the respective active regions AK1 to AK6.

The active regions AK1, AK3, and AK5 are arranged side by side in the lateral direction, and the active regions AK2, AK4, and AK6 are arranged side by side in the lateral direction. The active regions AK1 and AK2 are arranged longitudinally, the active regions AK3 and AK4 are arranged longitudinally, and the active regions AK5 and AK6 are arranged longitudinally.

Gate electrodes G1, G5, G6, and G10 are arranged in parallel to one another so as to cross the active regions AK1 and AK2 longitudinally. The gate electrode G4 is arranged between the gate electrodes G1 and G5 so as to cross the active region AK1 longitudinally. The gate electrode G2 is arranged between the gate electrodes G1 and G5 so as to cross the active region AK2 longitudinally. The gate electrode G3 is arranged so as to cross the active region AK1 longitudinally between the gate electrodes G1 and G4, and so as to cross the active region AK2 longitudinally between the gate electrodes G2 and G5. The gate electrode G7 is arranged so as to cross the active region AK1 longitudinally between the gate electrodes G6 and G10. The gate electrode G9 is arranged so as to cross the active region AK2 longitudinally between the gate electrodes G6 and G10. The gate electrode G8 is arranged so as to cross the active region AK1 longitudinally between the gate electrodes G7 and G10, and so as to cross the active region AK2 longitudinally between the gate electrodes G6 and G9.

The gate electrodes G11 and G12 are arranged in parallel to each other so as to cross the active regions AK3 and AK4 longitudinally. The gate electrodes G13 and G14 are arranged in parallel to each other so as to cross the active regions AK5 and AK6 longitudinally. The gate electrodes G1, G2, G4 to G6, and G8 to G14 can be linearly formed, and the gate electrodes G3 and G8 can be formed into a crank shape.

On the active regions AK1 to AK6, the channel regions are formed below the gate electrodes G1 to G14, and the diffusion layers are formed on both sides. The active regions AK1, AK3, and AK5 can be formed as P-type impurity diffusion layers, while the active regions AK2, AK4, and AK6 can be formed as N-type impurity diffusion layers.

On the active region AK1, the channel region of the P-channel field-effect transistor MP1 is formed below the gate electrode G1, the channel region of the P-channel field-effect transistor MP2 is formed below the gate electrode G3, the channel region of the P-channel field-effect transistor MP5 is formed below the gate electrode G4, the channel region of the P-channel field-effect transistor MP4 is formed below the gate electrode G5, the channel region of the P-channel field-effect transistor MP3 is formed below the gate electrode G6, the channel region of the P-channel field-effect transistor MP6 is formed below the gate electrode G7, the channel region of the P-channel field-effect transistor MP9 is formed below the gate electrode G8, and the channel region of the P-channel field-effect transistor MP8 is formed below the gate electrode G10.

On the active region AK2, the channel region of the N-channel field-effect transistor MN2 is formed below the gate electrode G1, the channel region of the N-channel field-effect transistor MN1 is formed below the gate electrode G2, the channel region of the N-channel field-effect transistor MN4 is formed below the gate electrode G3, the channel region of the N-channel field-effect transistor MN5 is formed below the gate electrode G5, the channel region of the N-channel field-effect transistor MN3 is formed below the gate electrode G6, the channel region of the N-channel field-effect transistor MN6 is formed below the gate electrode G8, the channel region of the N-channel field-effect transistor MN8 is formed below the gate electrode G9, and the channel region of the N-channel field-effect transistor MN9 is formed below the gate electrode G10.

On the active region AK3, the channel region of the P-channel field-effect transistor MP7 is formed below the gate electrode G11, and the channel region of the P-channel field-effect transistor MP10 is formed below the gate electrode G12.

On the active region AK4, the channel region of the N-channel field-effect transistor MN7 is formed below the gate electrode G11, and the channel region of the N-channel field-effect transistor MN10 is formed below the gate electrode G12.

On the active region AK5, the channel region of the P-channel field-effect transistor MP11 is formed below the gate electrode G13, and the channel region of the P-channel field-effect transistor MP12 is formed below the gate electrode G14.

On the active region AK6, the channel region of the N-channel field-effect transistor MN11 is formed below the gate electrode G13, and the channel region of the N-channel field-effect transistor MN12 is formed below the gate electrode G14.

Wirings H1 and H2 are arranged in parallel to each other, wherein the active regions AK1 to AK6 are sandwiched therebetween. The wiring H1 can supply power supply voltage VDDC, and the wiring H2 can supply power supply voltage VSSC.

The diffusion layer of the active region AK1 at the left side of the gate electrode G1 is connected to the wiring H1 via a wiring H8. The diffusion layer of the active region AK2 at the left side of the gate electrode G1 is connected to the wiring H2 via a wiring H9. The gate electrode G1 is connected to a wiring H10. The diffusion layer of the active region AK1 between the gate electrodes G3 and G4 is connected to a wiring H11. The diffusion layer of the active region AK2 between the gate electrodes G3 and G4 is connected the gate electrode G6 via a wiring H17. The wiring H11 is connected to the wiring H17 via a wiring H30. The gate electrode G5 is connected to the diffusion layer on the active region AK1 between the gate electrodes G6 and G7 via a wiring H14. The diffusion layer on the active region AK2 between the gate electrodes G6 and G8 is connected to a wiring H19. The wiring H14 is connected to the wiring H19 via a wiring H32. The diffusion layer of the active region AK1 between the gate electrodes G5 and G6 is connected the wiring H1 via a wiring H13. The diffusion layer of the active region AK2 between the gate electrodes G5 and G6 is connected the wiring H2 via a wiring H18.

The diffusion layer on the active region AK1 at the right side of the gate electrode G10 is connected to the wiring H1 via a wiring H23. The diffusion layer on the active region AK2 at the right side of the gate electrode G10 is connected to the wiring H2 via a wiring H24. The gate electrode G10 is connected to a wiring H22. The diffusion layer of the active region AK1 between the gate electrodes G7 and G8 is connected to the diffusion layer on the active region AK2 between the gate electrodes G8 and G9 via a wiring H21.

The gate electrode G2 is connected to a wiring H12. The gate electrode G9 is connected to a wiring H20. The gate electrode G4 is connected to the gate electrode G7 via a wiring H15. The wiring H12 is connected to the wiring H15 via a wiring H31, while the wiring H20 is connected to the wiring H15 via a wiring H33. The gate electrode G3 is connected to the gate electrode G8 via a wiring H16.

The gate electrode G14 is connected to the diffusion layer on the active regions AK5 and AK6 at the left side of the gate electrode G13 via a wiring H3. The gate electrode G13 is connected to a wiring H4. The diffusion layer of the active region AK5 between the gate electrodes G13 and G14 is connected the wiring H1 via a wiring H5. The diffusion layer of the active region AK6 between the gate electrodes G13 and G14 is connected the wiring H2 via a wiring H6. The diffusion layer on the active region AK5 at the right side of the gate electrode G14 is connected to the diffusion layer on the active region AK6 at the right side of the gate electrode G14 via a wiring H7.

The gate electrode G12 is connected to the diffusion layer on the active regions AK3 and AK4 at the left side of the gate electrode G11 via a wiring H25. The gate electrode G11 is connected to a wiring H28. The diffusion layer of the active region AK3 between the gate electrodes G11 and G12 is connected the wiring H1 via a wiring H26. The diffusion layer of the active region AK4 between the gate electrodes G11 and G12 is connected the wiring H2 via a wiring H27. The diffusion layer on the active region AK3 at the right side of the gate electrode G12 is connected to the diffusion layer on the active region AK4 at the right side of the gate electrode G12 via a wiring H29.

The wiring H7 is connected to the wiring H31 via a wiring H34. The wiring H3 is connected to the wiring H12 via a wiring H35. The wiring H25 is connected to the wiring H22 via a wiring H36. The wiring H28 is connected to the wiring H21 via a wiring H37.

The gate electrodes G1 to G14 can be made of polycrystalline silicon, for example. The wirings H1 to H37 can be made of a metal such as Al or Cu. The wirings H1 to H37 can be arranged on upper layers of the gate electrodes G1 go G14. A multilayer wiring can be used for the wirings H1 to H37. For example, an Al wiring is used for the first layer of the wirings H1 to H29, an Al wiring is used for the second layer of the wirings H30 to H33, and an Al wiring can be used for the third layer of the wirings H34 to H37.

The respective regions are separated in such a manner that each of the widths W1 to W6 of each of the active regions AK1 to AK6 is uniform in the respective regions, whereby the irregularities on the layout of the respective active regions AK1 to AK6 are eliminated. Accordingly, the variation in the characteristic caused by the semiconductor manufacturing process can be reduced, and stress due to the polycrystalline silicon on the active regions AK1 to AK6 can be made uniform. Consequently, a variation in timing in delay, setup, and hold of the flip-flop circuit can be reduced.

The gate electrodes G2, G4, G7, G9, and G14, to which the clock signal PN is applied are isolated from one another, and these gate electrodes G2, G4, G7, G9, and G14 are connected to one another with the wirings H12, H15, H20, H31, H33, and H34. On the other hand, the gate electrodes G3 and G8 to which the clock signal P is applied are isolated from each other, and the gate electrodes G3 and G8 are connected with each other via the wiring H16. With this structure, it becomes unnecessary to extend the polycrystalline silicon among the gate electrodes G2, G4, G7, G9, and G14, and to extend the polycrystalline silicon between the gate electrodes G3 and G8. Accordingly, it is unnecessary to design the layout of the active regions AK1 to AK6 for avoiding the polycrystalline silicon that is used for the extension. Consequently, the active region can be divided in such a manner that each of the widths W1 to W6 of each of the active regions AK1 to AK6 becomes uniform in the respective regions, while suppressing the decrease in the widths of the active regions AK1 to AK6.

When the widths W1 to W6 of the active regions AK1 to AK6 are increased to the maximum, the flip-flop with high speed can be formed, and when the widths W1 to W6 of the active regions AK1 to AK6 are decreased to the minimum, the low-power-consumption flip-flop that suppresses leak current can be formed.

In the above-mentioned embodiment, the active regions AK1 and AK2 are shared by the clocked inverters 1, 3, and 6, transfer gate 4, and the inverter 2, and the active regions AK3 and AK4 are shared by the inverters 5 and 7. However, the present invention is not limited to the method of dividing the active region into six active regions AK1 to AK6. Another method may be employed. For example, the active region may be divided between the inverters 5 and 7, between the clocked inverters 1 and 3, or between the transfer gate 4 and the clocked inverter 6.

(Second Embodiment)

Figure 6:
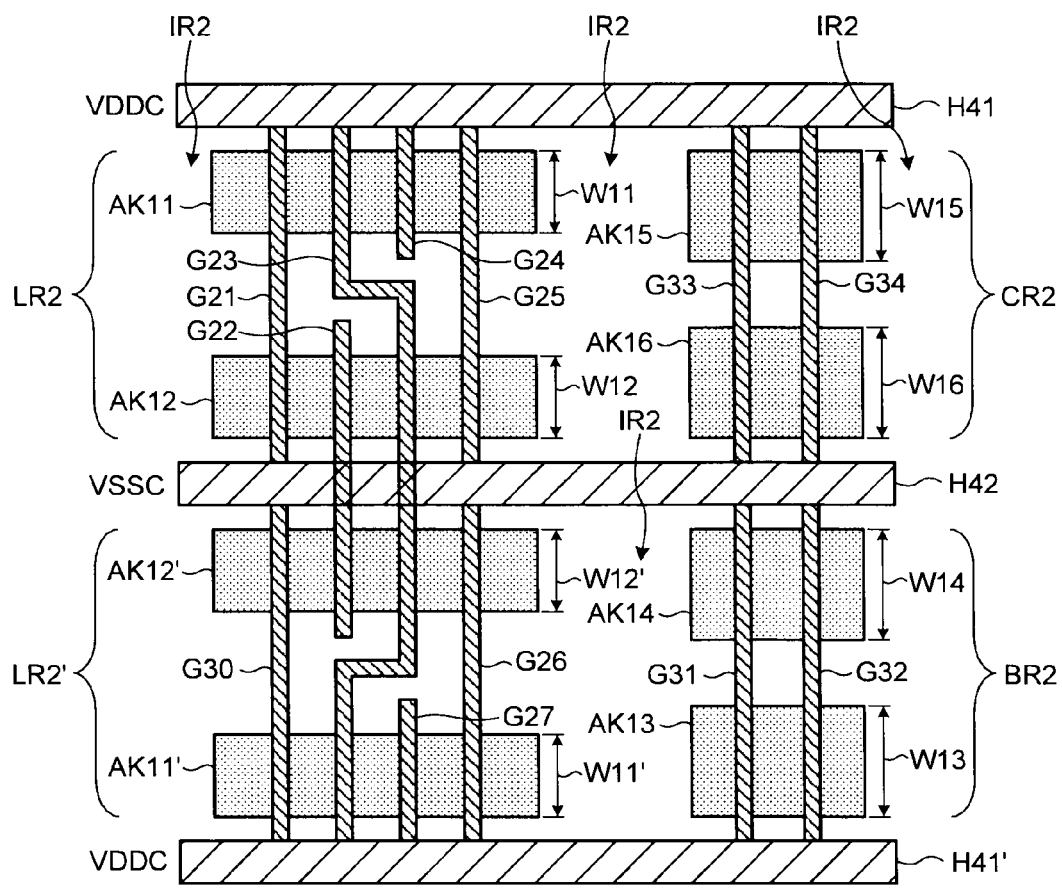
FIG. 6 is a plan view illustrating a layout structure of gate electrodes and active regions of a semiconductor integrated circuit according to a second embodiment.
Figure 7:
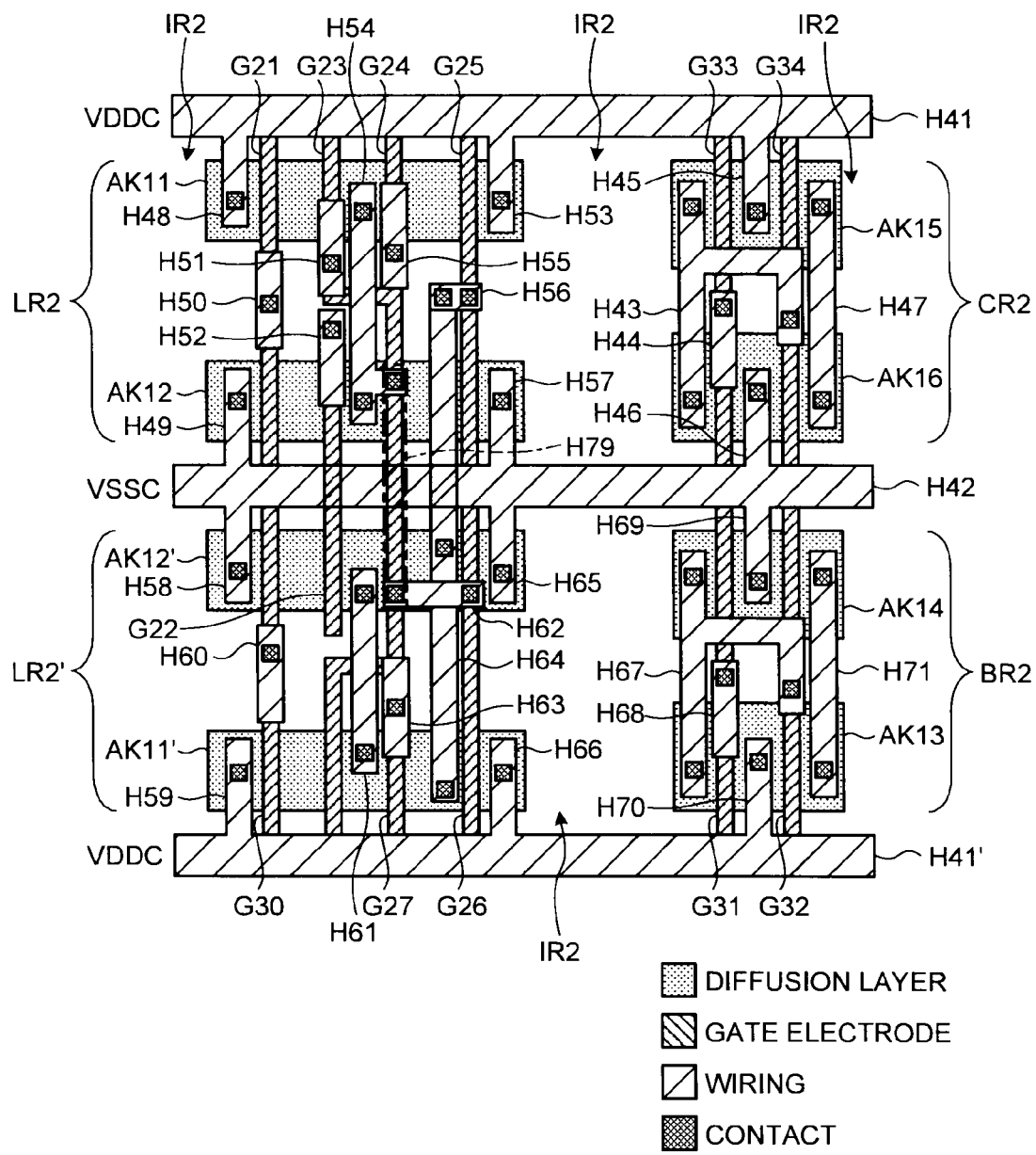
FIG. 7 is a plan view illustrating a layout structure when wirings are added to a latch portion in the semiconductor integrated circuit in FIG. 6.
Figure 8:
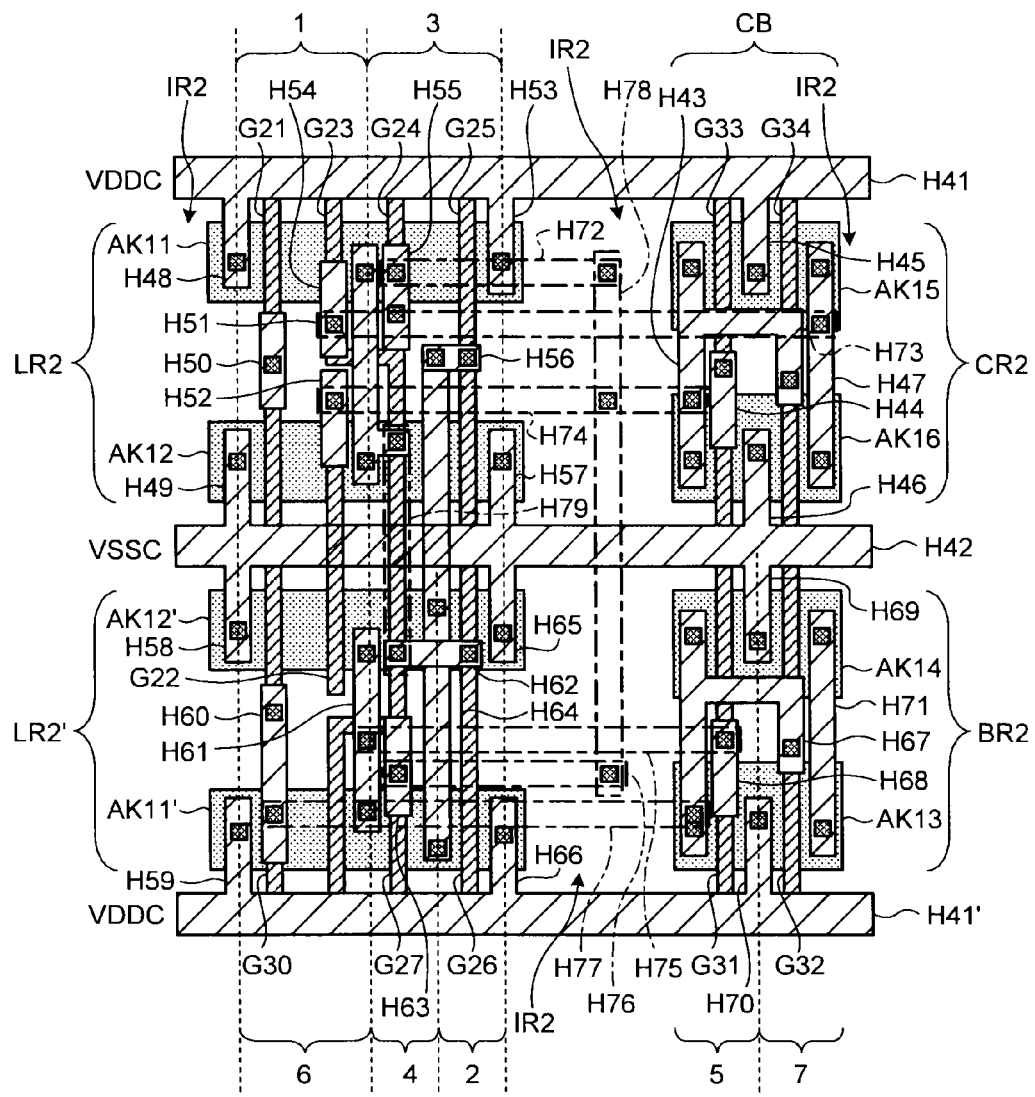
FIG. 8 is a plan view illustrating a layout structure when wirings are added among the latch portion, a clock portion, and a buffer portion in the semiconductor integrated circuit in FIG. 7.

FIG. 6 is a plan view illustrating a layout structure of gate electrodes and active regions of a semiconductor integrated circuit according to a second embodiment; FIG. 7 is a plan view illustrating a layout structure when wirings are added to a latch portion in the semiconductor integrated circuit in FIG. 6; and FIG. 8 is a plan view illustrating a layout structure when wirings are added among the latch portion, a clock portion, and a buffer portion in the semiconductor integrated circuit in FIG. 7.

In FIG. 6, a semiconductor chip includes a clock region CR2, latch regions LR2 and LR2', and a buffer region BR2. The inverters 8 and 9 in FIG. 2 are formed on the clock region CR2. The clocked inverters 1 and 3 in FIG. 2 are formed on the latch region LR2. The clocked inverter 6, the transfer gate 4, and the inverter 2 in FIG. 2 are formed on the latch region LR2'. The inverters 5 and 7 in FIG. 2 are formed on the buffer region BR2.

Specifically, active regions AK15 and AK16 are formed on the clock region CR2, active regions AK11 and AK12 are formed on the latch region LR2, active regions AK11' and AK12' are formed on the latch region LR2', and active regions AK13 and AK14 are formed on the buffer region BR2. The active regions AK11 to AK16, AK11', and AK12' are isolated from one another across a device isolation region IR2. The active regions AK11 to AK16, AK11', and AK12' are separated in such a manner that each of widths of each of the active regions is uniform in the respective regions.

The active regions AK11 and AK15 are arranged side by side in the lateral direction, the active regions AK12 and AK16 are arranged side by side in the lateral direction, the active regions AK12' and AK14 are arranged side by side in the lateral direction, and the active regions AK11' and AK13 are arranged side by side in the lateral direction. The active regions AK11, AK12, AK12', and AK11' are arranged longitudinally, and the active regions AK15, AK16, AK13, and AK14 are arranged longitudinally.

Gate electrodes G21 and G25 are arranged in parallel to one another so as to cross the active regions AK11 and AK12 longitudinally. Gate electrodes G30 and G26 are arranged in parallel to each other so as to cross the active regions AK11' and AK12' longitudinally. A gate electrode G24 is arranged between the gate electrodes G21 and G25 so as to cross the active region AK11 longitudinally. A gate electrode G27 is arranged between the gate electrodes G30 and G26 so as to cross the active region AK11' longitudinally. A gate electrode G22 is arranged between the gate electrodes G21 and G30, and between the gate electrodes G25 and G26, so as to cross the active regions AK12 and AK12' longitudinally. The gate electrode G23 is arranged so as to cross the active region AK11 longitudinally between the gate electrodes G21 and G24, so as to cross the active region AK12 longitudinally between the gate electrodes G22 and G25, so as to cross the active region AK12' longitudinally between the gate electrodes G22 and G26, and so as to across the active region AK11' longitudinally between the gate electrodes G30 and G27.

Gate electrodes G31 and G32 are arranged in parallel to each other so as to cross the active regions AK13 and AK14 longitudinally. Gate electrodes G33 and G34 are arranged in parallel to each other so as to cross the active regions AK15 and AK16 longitudinally. The gate electrodes G21, G22, G24 to G27, and G30 to G34 can be linearly formed, and the gate electrode G23 can be formed into a crank shape.

On the active regions AK11 to AK16, AK11', and AK12', channel regions are formed below the gate electrodes G21 to G27, and G30 to G34, and diffusion layers are formed on both sides. The active regions AK11, AK11', AK13, and AK15 can be formed as P-type impurity diffusion layers, while the active regions AK12, AK12', AK14, and AK16 can be formed as N-type impurity diffusion layers.

On the active region AK11, the channel region of the P-channel field-effect transistor MP1 is formed below the gate electrode G21, the channel region of the P-channel field-effect transistor MP2 is formed below the gate electrode G23, the channel region of the P-channel field-effect transistor MP5 is formed below the gate electrode G24, and the channel region of the P-channel field-effect transistor MP4 is formed below the gate electrode G25.

On the active region AK11', the channel region of the P-channel field-effect transistor MP3 is formed below the gate electrode G26, the channel region of the P-channel field-effect transistor MP6 is formed below the gate electrode G27, the channel region of the P-channel field-effect transistor MP9 is formed below the gate electrode G23, and the channel region of the P-channel field-effect transistor MP8 is formed below the gate electrode G30.

On the active region AK12, the channel region of the N-channel field-effect transistor MN2 is formed below the gate electrode G21, the channel region of the N-channel field-effect transistor MN1 is formed below the gate electrode G22, the channel region of the N-channel field-effect transistor MN4 is formed below the gate electrode G23, and the channel region of the N-channel field-effect transistor MN5 is formed below the gate electrode G25.

On the active region AK12', the channel region of the N-channel field-effect transistor MN3 is formed below the gate electrode G26, the channel region of the N-channel field-effect transistor MN6 is formed below the gate electrode G23, the channel region of the N-channel field-effect transistor MN8 is formed below the gate electrode G22, and the channel region of the N-channel field-effect transistor MN9 is formed below the gate electrode G30.

On the active region AK13, the channel region of the P-channel field-effect transistor MP7 is formed below the gate electrode G31, and the channel region of the P-channel field-effect transistor MP10 is formed below the gate electrode G32.

On the active region AK14, the channel region of the N-channel field-effect transistor MN7 is formed below the gate electrode G31, and the channel region of the N-channel field-effect transistor MN10 is formed below the gate electrode G32.

On the active region AK15, the channel region of the P-channel field-effect transistor MP11 is formed below the gate electrode G33, and the channel region of the P-channel field-effect transistor MP12 is formed below the gate electrode G34.

On the active region AK16, the channel region of the N-channel field-effect transistor MN11 is formed below the gate electrode G33, and the channel region of the N-channel field-effect transistor MN12 is formed below the gate electrode G34.

Wirings H41 and 41' are arranged laterally in parallel to each other, wherein the active regions AK11 to AK16, AK11', and AK12' are sandwiched therebetween, while a wiring H42 is arranged in parallel laterally between the active regions AK12 and AK16, and the active regions AK12' and AK14.

Specifically, the active regions AK11 to AK 16, AK11', and AK12', and the gate electrodes G21, G22, G24 to G27, and G30 to G34 are arranged so as to be symmetric with respect to the wiring H42 as illustrated in FIG. 6. The wirings H41 and H41' can supply power supply voltage VDDC, and the wiring H42 can supply power supply voltage VSSC.

The diffusion layer on the active region AK11 at the left side of the gate electrode G21 is connected to the wiring H41 via a wiring H48. The diffusion layer on the active region AK12 at the left side of the gate electrode G21 is connected to the wiring H42 via a wiring H49. The diffusion layer on the active region AK11 at the right side of the gate electrode G21 is connected to the wiring H41 via a wiring H53. The diffusion layer on the active region AK12 at the right side of the gate electrode G21 is connected to the wiring H42 via a wiring H57. The gate electrode G21 is connected to a wiring H50. The gate electrode G22 is connected to a wiring H52. The gate electrode G23 is connected to a wiring H51. The gate electrode G24 is connected to a wiring H55. The gate electrode G25 is connected to a wiring H56. The diffusion layer of the active region AK11 between the gate electrodes G23 and G24 is connected to the diffusion layer on the active region AK12 between the gate electrodes G22 and G23 via a wiring H54.

The diffusion layer on the active region AK11' at the left side of the gate electrode G30 is connected to the wiring H41' via a wiring H59. The diffusion layer on the active region AK12' at the left side of the gate electrode G30 is connected to the wiring H42 via a wiring H58. The diffusion layer on the active region AK11' at the right side of the gate electrode G26 is connected to the wiring H41' via a wiring H66. The diffusion layer on the active region AK12' at the right side of the gate electrode G26 is connected to the wiring H42 via a wiring H65. The gate electrode G30 is connected to a wiring H60. The gate electrode G27 is connected to a wiring H63. The gate electrode G26 is connected to a wiring H62. The diffusion layer of the active region AK11' between the gate electrodes G23 and G27 is connected to the diffusion layer on the active region AK12' between the gate electrodes G22 and G23 via a wiring H61.

The wiring 54 is connected to the wiring H62 via a wiring H79. The wiring H56 is connected to the diffusion layer on the active region AK11' between the gate electrodes G27 and G26, and to the diffusion layer on the active region AK12' between the gate electrodes G23 and G26 via a wiring H64.

The gate electrode G34 is connected to the diffusion layer on the active regions AK15 and AK16 at the left side of the gate electrode G33 via the wiring H43. The gate electrode G33 is connected to a wiring H44. The diffusion layer on the active region AK15 between the gate electrodes G33 and G34 is connected to the wiring H41 via a wiring H45. The diffusion layer on the active region AK16 between the gate electrodes G33 and G34 is connected to the wiring H42 via a wiring H46. The diffusion layer on the active region AK15 at the right side of the gate electrode G34 is connected to the diffusion layer on the active region AK16 at the right side of the gate electrode G34 via a wiring H47.

The gate electrode G32 is connected to the diffusion layer on the active regions AK13 and AK14 at the left side of the gate electrode G31 via the wiring H67. The gate electrode G31 is connected to a wiring H68. The diffusion layer on the active region AK13 between the gate electrodes G31 and G32 is connected to the wiring H41 via a wiring H70. The diffusion layer on the active region AK14 between the gate electrodes G31 and G32 is connected to the wiring H42 via a wiring H69. The diffusion layer on the active region AK13 at the right side of the gate electrode G32 is connected to the diffusion layer on the active region AK14 at the right side of the gate electrode G32 via a wiring H71.

The wiring H55 is connected to a wiring H78 via a wiring H72. The wiring H72 is connected to wirings H74 and H76 via the wiring H78. The wiring H51 is connected to the wiring H47 via a wiring H73. The wiring H52 is connected to the wirings H43 and H78 via the wiring H74. The wiring H61 is connected to the wiring H68 via a wiring H75. The wiring H63 is connected to the wiring H78 via the wiring H76. The wiring H60 is connected to the wiring H67 via a wiring H77.

The gate electrodes G21 to G27 and G30 to G34 can be made of polycrystalline silicon, for example. The wirings H41 to H79 and H41' can be made of a metal such as Al or Cu. The wirings H41 to H79 and H41' can be arranged on upper layers of the gate electrodes G21 to G27 and G30 to G34. A multilayer wiring can be used for the wirings H41 to H79 and H41'. For example, an Al wiring is used for the first layer of the wirings H41 to H63, H65 to H71, and H41', an Al wiring is used for the second layer of the wirings H64, H78, and H79, and an Al wiring can be used for the third layer of the wirings H72 to H77.

The respective regions are separated in such a manner that each of the widths of each of the active regions AK11 to AK16, AK11', and AK12' is uniform in the respective regions, whereby the irregularities on the layout of the respective active regions AK11 to AK16, AK11', and AK12' are eliminated. Accordingly, the variation in the characteristic caused by the semiconductor manufacturing process can be reduced, and stress due to the polycrystalline silicon on the active regions AK11 to AK16, AK11', and AK12' can be made uniform. Consequently, a variation in timing in delay, setup, and hold of the flip-flop circuit can be reduced.

The gate electrodes G22, G24, G27, and G34, to which the clock signal PN is applied are isolated from one another, and these gate electrodes G22, G24, G27, and G34 are connected to one another with the wirings H52, H55, H63, H72, H74, H76, and H78. With this structure, it becomes unnecessary to extend the polycrystalline silicon among the gate electrodes G22, G24, G27, and G34. Accordingly, it is unnecessary to design the layout of the active regions AK11 to AK16, AK11', and AK12' for avoiding the polycrystalline silicon that is used for the extension. Consequently, the active region can be divided in such a manner that each of the widths of each of the active regions AK11 to AK16, AK11', and AK12' becomes uniform in the respective regions, while suppressing the decrease in the widths of the active regions AK11 to AK16, AK11', and AK12'.

When the widths W11 to W16, W11', and W12' of the active regions AK11 to AK16, AK11', and AK12' are increased to the maximum, the flip-flop with high speed can be formed, and when the widths W11 to W16, W11', and W12' of the active regions AK11 to AK16, AK11', and AK12' are decreased to the minimum, the low-power-consumption flip-flop that suppresses leak current can be formed.

(Third Embodiment)

Figure 9:
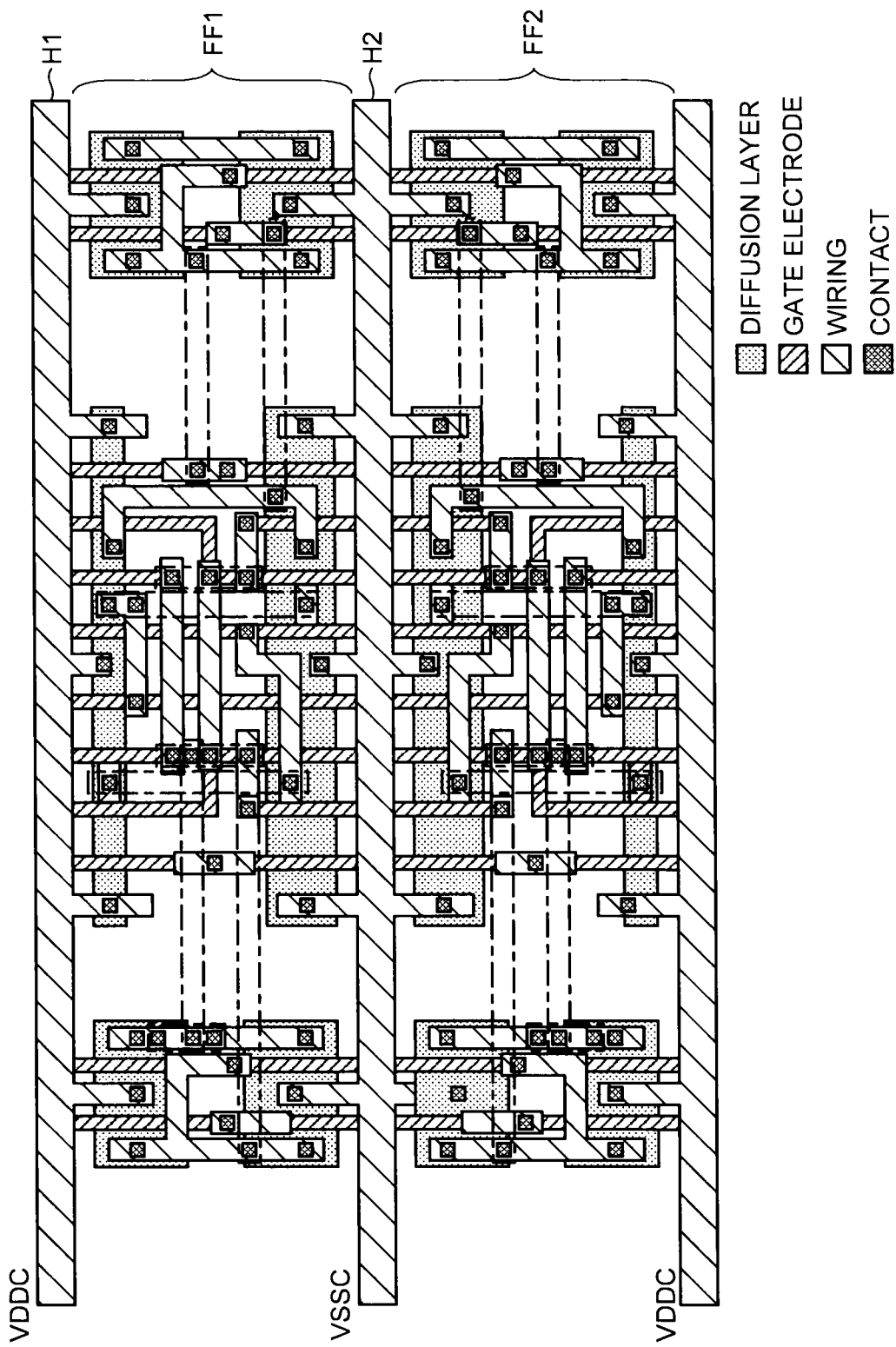
FIG. 9 is a plan view illustrating a layout structure of gate electrodes, active regions, and wirings of a semiconductor integrated circuit according to a third embodiment.

FIG. 9 is a plan view illustrating a layout structure of gate electrodes, active regions, and wirings of a semiconductor integrated circuit according to a third embodiment.

In FIG. 9, the semiconductor circuit includes flip-lop circuits FF1 and FF2. The flip-flop circuits FF1 and FF2 can be similar in configuration of the flip-flop circuit in FIG. 5. The flip-flop circuit FF2 can be arranged adjacent to the flip-flop circuit FF1 so as to be symmetric with respect to the wiring H2.

Since the flip-flop circuits FF1 and FF2 are arranged to be adjacent to each other, the direction of the variation in characteristics of the flip-flop circuits FF1 and FF2 can be matched, whereby the design of the flip-flop circuits FF1 and FF2 can be facilitated.

(Fourth Embodiment)

Figure 10:
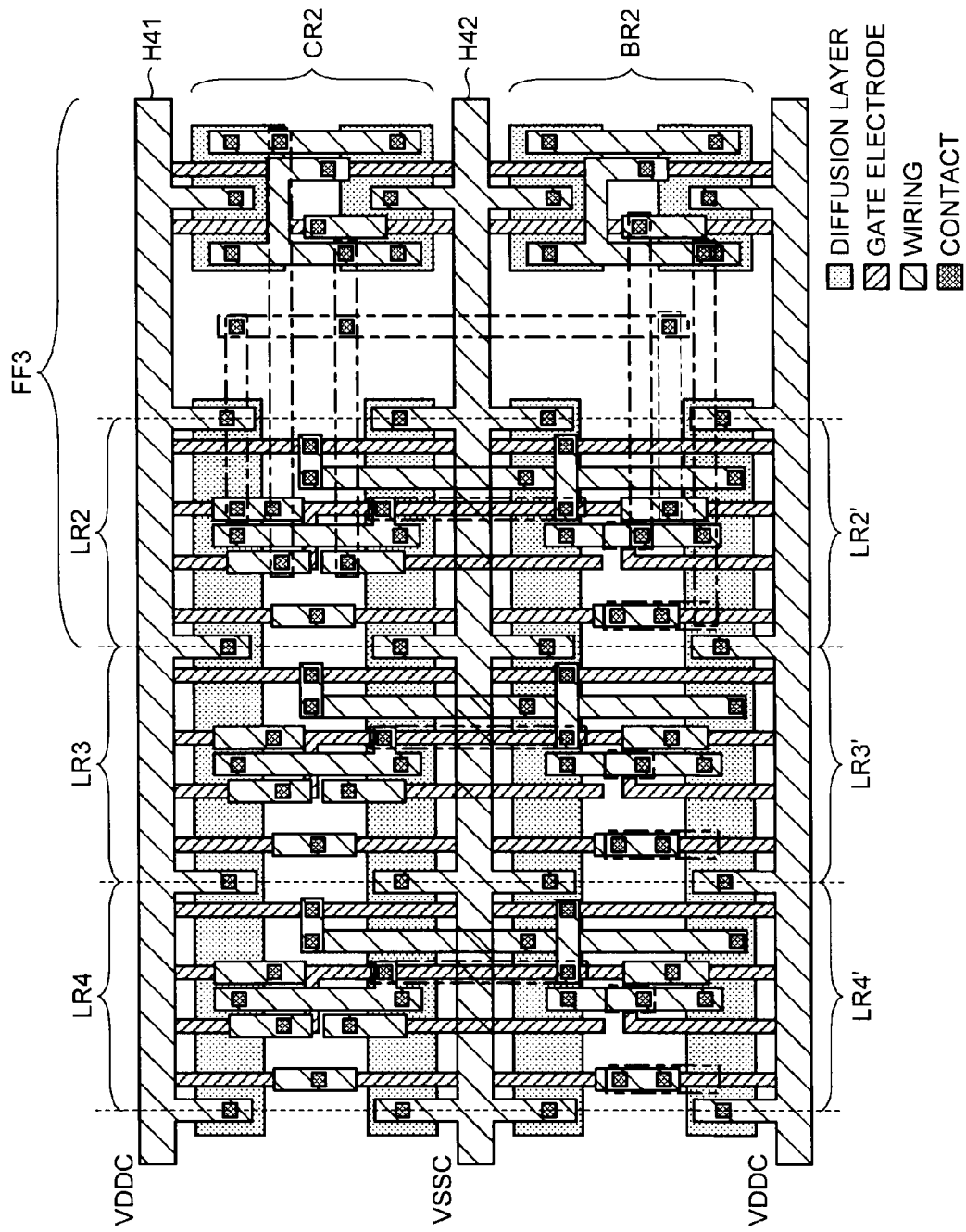
FIG. 10 is a plan view illustrating a layout structure of gate electrodes, active regions, and wirings of a semiconductor integrated circuit according to a fourth embodiment.

FIG. 10 is a plan view illustrating a layout structure of gate electrodes, active regions, and wirings of a semiconductor integrated circuit according to a fourth embodiment.

In FIG. 10, the semiconductor integrated circuit includes a flip-lop circuit FF3, and latch regions LR3, LR3', LR4, and LR4'. The flip-flop circuit FF3 can be similar in configuration of the flip-flop circuit in FIG. 8. The latch regions LR3 and LR4 can be similar in configuration of the latch region LR2. The latch regions LR3' and LR4' can be similar in configuration of the latch region LR2'.

The latch region LR3 can be arranged to be adjacent to the latch region LR2, and the latch region LR4 can be arranged to be adjacent to the latch region LR3. The latch region LR3' can be arranged to be adjacent to the latch region LR2', and the latch region LR4' can be arranged to be adjacent to the latch region LR3'. A clock region and a buffer region corresponding to the latch regions LR3, LR3', LR4, and LR4' can be arranged in a space around the flip-flop circuit FF3 and the latch regions LR3, LR3', LR4, and LR4'.

Since the latch regions LR2 to LR4, and LR2' to LR4' are arranged adjacent to one another, the direction of the variation in characteristics of the latch regions LR2 to LR4 and LR2' to LR4' can be matched, whereby the design of the latch regions LR2 to LR4 and LR2' to LR4' can be facilitated.

(Fifth Embodiment)

Figure 11:
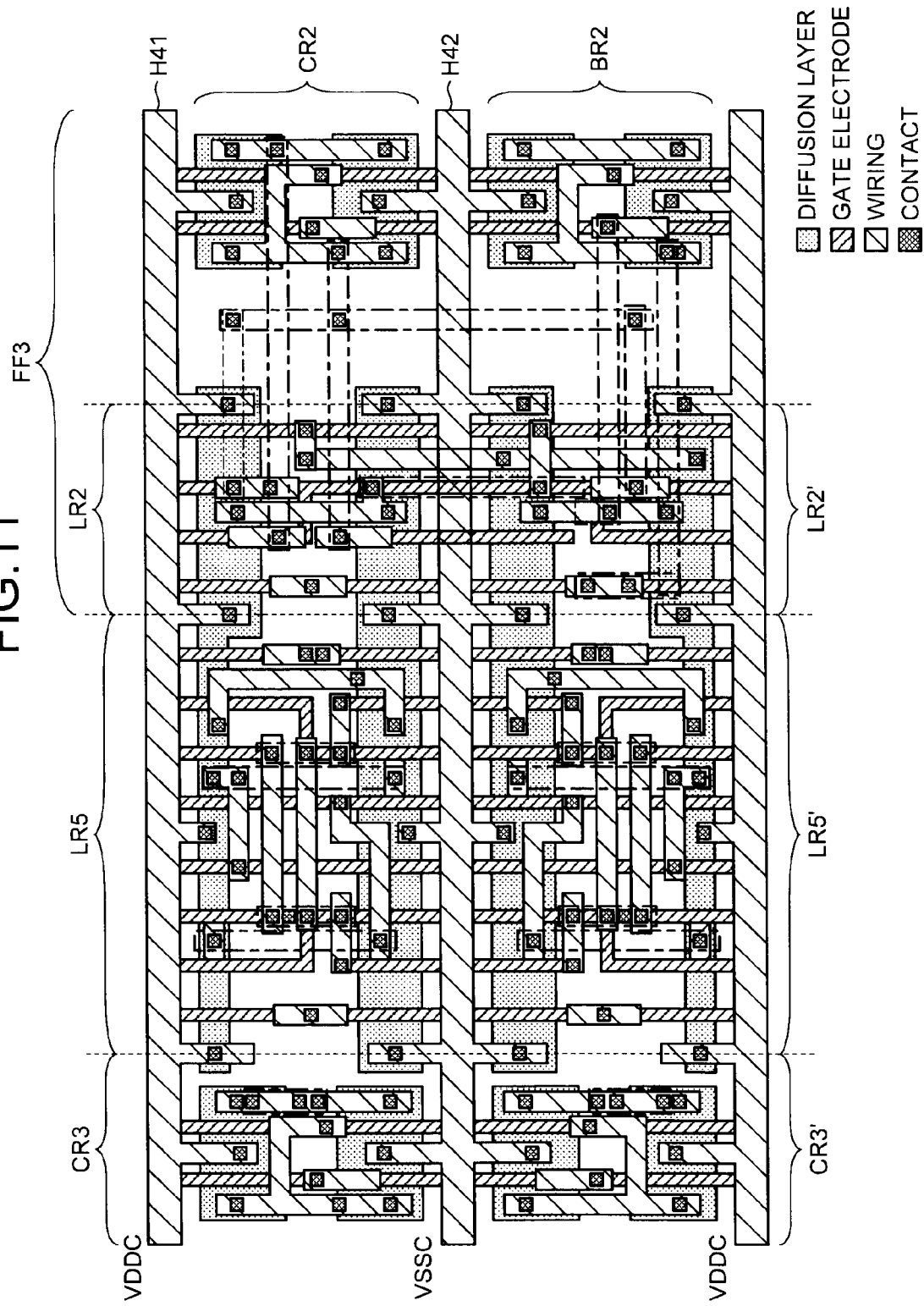
FIG. 11 is a plan view illustrating a layout structure of gate electrodes, active regions, and wirings of a semiconductor integrated circuit according to a fifth embodiment.

FIG. 11 is a plan view illustrating a layout structure of gate electrodes, active regions, and wirings of a semiconductor integrated circuit according to a fifth embodiment.

In FIG. 11, the semiconductor integrated circuit includes a flip-lop circuit FF3, latch regions LR5 and LR5', and clock regions CR3 and CR3'. The flip-flop circuit FF3 can be similar in configuration of the flip-flop circuit in FIG. 8. The latch regions LR5 and LR5' can be similar in configuration of the latch region LR1 in FIG. 4. The clock regions CR3 and CR3' can be similar in configuration of the clock region CR1 in FIG. 4.

The latch region LR5 can be arranged adjacent to the latch region LR5' so as to be symmetric with respect to the wiring H42. The clock region CR3 can be arranged adjacent to the clock region CR3' so as to be symmetric with respect to the wiring H42. The latch region LR5 can be arranged to be adjacent to the latch region LR2, and the clock region CR3 can be arranged to be adjacent to the latch region LR5. The latch region LR5' can be arranged to be adjacent to the latch region LR2', and the clock region CR3' can be arranged to be adjacent to the latch region LR5'. A clock region and a buffer region corresponding to the latch regions LR5 and LR5' can be arranged in a space around the flip-flop circuit FF3, the latch regions LR5 and LR5', and the clock regions CR3 and CR3'.

Since the latch regions LR2, LR5, LR2' and LR5' are arranged adjacent to one another, the direction of the variation in characteristics of the latch regions LR2, LR5, LR2' and LR5' can be matched, whereby the design of the latch regions LR2, LR5, LR2' and LR5' can be facilitated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit having mounted thereto a flip-flop circuit including a latch portion that takes and holds input data based upon a clock signal, and a clock portion that inputs the clock signal to the latch portion,
   wherein an active region of the flip-flop circuit is divided in such a manner that the width of each of the active regions is secured, and each of the active regions has a uniform width, and
   wherein the width of the active regions of the latch portion and the clock portion are different from each other.

2. The semiconductor integrated circuit according to claim 1, wherein the active region of the latch portion and the active region of the clock portion are isolated from each other.

3. The semiconductor integrated circuit according to claim 2, further comprising a buffer portion that outputs output data based upon the input data held in the latch portion,
   wherein the active region of the latch portion, the active region of the clock portion, and the active region of the buffer portion are isolated from one another.

4. The semiconductor integrated circuit according to claim 1, comprising:
   a first gate electrode mounted to a transistor, to which the clock signal is inputted, on the latch portion;
   a second gate electrode that is mounted to a transistor of the clock portion and is isolated from the first gate electrode; and
   a wiring that is arranged on upper layers of the first gate electrode and the second gate electrode so as to connect the first gate electrode and the second gate electrode.

5. The semiconductor integrated circuit according to claim 1, wherein the latch portions are arranged adjacent to one another in a lateral direction and longitudinal direction.

6. The semiconductor integrated circuit according to claim 1, wherein
   the latch portion includes a master portion that holds the input data taken in a current process, and
   a slave portion that takes and holds the input data that is held by the master portion in the current process.

7. The semiconductor integrated circuit according to claim 6, wherein
   the master portion includes:
   a first clocked inverter;
   a first inverter connected next to the first clocked inverter; and
   a second clocked inverter that is connected to the first inverter in an inverse-parallel manner, and
   the slave portion includes:
   a transfer gate connected next to the first inverter;
   a second inverter connected next to the transfer gate; and
   a third clocked inverter that is connected to the second inverter in an inverse-parallel manner.

8. The semiconductor integrated circuit according to claim 7, wherein the buffer portion includes a third inverter.

9. The semiconductor integrated circuit according to claim 8, wherein the clock portion includes a fourth inverter, and a fifth inverter connected next to the fourth inverter.

10. The semiconductor integrated circuit according to claim 9, wherein
    the first clocked inverter includes:
    a first P-channel field-effect transistor;
    a second P-channel field-effect transistor connected in series with the first P-channel field-effect transistor;
    a first N-channel field-effect transistor connected in series with the second P-channel field-effect transistor; and
    a second N-channel field-effect transistor connected in series with the first N-channel field-effect transistor,
    the first inverter includes:
    a third P-channel field-effect transistor; and
    a third N-channel field-effect transistor connected in series with the third P-channel field-effect transistor,
    the second clocked inverter includes:
    a fourth P-channel field-effect transistor;
    a fifth P-channel field-effect transistor connected in series with the fourth P-channel field-effect transistor;
    a fourth N-channel field-effect transistor connected in series with the fifth P-channel field-effect transistor; and
    a fifth N-channel field-effect transistor connected in series with the fourth N-channel field-effect transistor,
    the transfer gate includes:
    a sixth P-channel field-effect transistor; and
    a sixth N-channel field-effect transistor connected in parallel to the sixth P-channel field-effect transistor,
    the second inverter includes:
    a seventh P-channel field-effect transistor; and
    a seventh N-channel field-effect transistor connected in series with the seventh P-channel field-effect transistor,
    the third clocked inverter includes:
    an eighth P-channel field-effect transistor;
    a ninth P-channel field-effect transistor connected in series with the eighth P-channel field-effect transistor;

an eighth N-channel field-effect transistor connected in series with the ninth P-channel field-effect transistor; and a ninth N-channel field-effect transistor connected in series with the eighth N-channel field-effect transistor, the third inverter includes:

a tenth P-channel field-effect transistor; and a tenth N-channel field-effect transistor connected in series with the tenth P-channel field-effect transistor, the fourth inverter includes:

an eleventh P-channel field-effect transistor; and an eleventh N-channel field-effect transistor connected in series with the eleventh P-channel field-effect transistor, and the fifth inverter includes:

a twelfth P-channel field-effect transistor; and a twelfth N-channel field-effect transistor connected in series with the twelfth P-channel field-effect transistor.

11. The semiconductor integrated circuit according to claim 10, comprising:
a first active region having formed thereon the first to sixth, eighth, and ninth P-channel field-effect transistors, and having a uniform width;
a second active region having formed thereon the first to sixth, eighth, and ninth N-channel field-effect transistors, and having a uniform width;
a third active region having formed thereon seventh and tenth P-channel field-effect transistors and having a uniform width;
a fourth active region having formed thereon seventh and tenth N-channel field-effect transistors and having a uniform width;
a fifth active region having formed thereon eleventh and twelfth P-channel field-effect transistors and having a uniform width; and
a sixth active region having formed thereon eleventh and twelfth N-channel field-effect transistors and having a uniform width.

12. The semiconductor integrated circuit according to claim 11, wherein the first active region and the second active region are arranged longitudinally, the third active region and the fourth active region are arranged longitudinally, the fifth active region and the sixth active region are arranged longitudinally, the first active region, the third active region, and the fifth active region are arranged side by side in a lateral direction, and the second active region, the fourth active region, and the sixth active region are arranged side by side in a lateral direction.

13. The semiconductor integrated circuit according to claim 12, comprising:
a first gate electrode that is arranged so as to cross the first active region and the second active region, and forms a channel region of the first P-channel field-effect transistor and a channel region of the second N-channel field-effect transistor;
a second gate electrode that is arranged so as to cross the second active region, and forms a channel region of the first N-channel field-effect transistor;
a third gate electrode that is arranged so as to cross the first active region and the second active region, and forms a channel region of the second P-channel field-effect transistor and a channel region of the fourth N-channel field-effect transistor;
a fourth gate electrode that is arranged so as to cross the first active region, and forms a channel region of the fifth P-channel field-effect transistor;

a fifth gate electrode that is arranged so as to cross the first active region and the second active region, and forms a channel region of the fourth P-channel field-effect transistor and a channel region of the fifth N-channel field-effect transistor;
a sixth gate electrode that is arranged so as to cross the first active region and the second active region, and forms a channel region of the third P-channel field-effect transistor and a channel region of the third N-channel field-effect transistor;
a seventh gate electrode that is arranged so as to cross the first active region, and forms a channel region of the sixth P-channel field-effect transistor;
an eighth gate electrode that is arranged so as to cross the first active region and the second active region, and forms a channel region of the ninth P-channel field-effect transistor and a channel region of the sixth N-channel field-effect transistor;
a ninth gate electrode that is arranged so as to cross the second active region, and forms a channel of the eighth N-channel field-effect transistor;
a tenth gate electrode that is arranged so as to cross the first active region and the second active region, and forms a channel region of the eighth P-channel field-effect transistor and a channel region of the ninth N-channel field-effect transistor;
an eleventh gate electrode that is arranged so as to cross the third active region and the fourth active region, and forms a channel region of the seventh P-channel field-effect transistor and a channel region of the seventh N-channel field-effect transistor;
a twelfth gate electrode that is arranged so as to cross the third active region and the fourth active region, and forms a channel region of the tenth P-channel field-effect transistor and a channel region of the tenth N-channel field-effect transistor;
a thirteenth gate electrode that is arranged so as to cross the fifth active region and the sixth active region, and forms a channel region of the eleventh P-channel field-effect transistor and a channel region of the eleventh N-channel field-effect transistor; and
a fourteenth gate electrode that is arranged so as to cross the fifth active region and the sixth active region, and forms a channel region of the twelfth P-channel field-effect transistor and a channel region of the twelfth N-channel field-effect transistor.

14. The semiconductor integrated circuit according to claim 13, wherein the first, second, fourth to seventh, and ninth to fourteenth gate electrodes are linearly formed, and the third and eighth gate electrodes are formed into a crank shape.

15. The semiconductor integrated circuit according to claim 14, comprising:
a first wiring that electrically connects the second, fourth, seventh, ninth, and fourteenth gate electrodes; and
a second wiring that electrically connects the third and eighth gate electrodes.

16. The semiconductor integrated circuit according to claim 10, comprising:
a first active region having formed thereon the first, second, fourth, and fifth P-channel field-effect transistors, and having a uniform width;
a second active region having formed thereon the first, second, fourth, and fifth N-channel field-effect transistors, and having a uniform width;

a third active region having formed thereon the seventh and tenth P-channel field-effect transistor and having a uniform width;
a fourth active region having formed thereon the seventh and tenth N-channel field-effect transistor and having a uniform width;
a fifth active region having formed thereon the eleventh and twelfth P-channel field-effect transistor and having a uniform width; and
a sixth active region having formed thereon the eleventh and twelfth N-channel field-effect transistor and having a uniform width;
a seventh active region having formed thereon the third, sixth, eighth and ninth P-channel field-effect transistor, and having a uniform width; and
an eighth active region having formed thereon the third, sixth, eighth, and ninth N-channel field-effect transistor, and having a uniform width.

17. The semiconductor integrated circuit according to claim 16, wherein the first active region, the second active region, the seventh active region, and the eighth active region are arranged longitudinally, the third active region, the fourth active region, the fifth active region, and the sixth active region are arranged longitudinally, the first active region and the fifth active region are arranged side by side in a lateral direction, the second active region and the sixth active region are arranged side by side in a lateral direction, the seventh active region and the third active region are arranged side by side in a lateral direction, and the eighth active region and the fourth active region are arranged side by side in a lateral direction.

18. The semiconductor integrated circuit according to claim 17, comprising:
a first gate electrode that is arranged so as to cross the first active region and the second active region, and forms a channel region of the first P-channel field-effect transistor and a channel region of the second N-channel field-effect transistor;
a second gate electrode that is arranged so as to cross the second active region and the eighth active region, and forms channel regions of the first and eighth N-channel field-effect transistors;
a third gate electrode that is arranged so as to cross the first active region, the second active region, the seventh active region, and the eighth active region, and forms channel regions of the second and ninth P-channel field-effect transistors and channel regions of the fourth and sixth N-channel field-effect transistors;
a fourth gate electrode that is arranged so as to cross the first active region, and forms a channel region of the fifth P-channel field-effect transistor;
a fifth gate electrode that is arranged so as to cross the first active region and the second active region, and forms a channel region of the fourth P-channel field-effect transistor and a channel region of the fifth N-channel field-effect transistor;
a sixth gate electrode that is arranged so as to cross the seventh active region and the eighth active region, and forms a channel region of the third P-channel field-effect transistor and a channel region of the third N-channel field-effect transistor;
a seventh gate electrode that is arranged so as to cross the seventh active region, and forms a channel region of the sixth P-channel field-effect transistor;
an eighth gate electrode that is arranged so as to cross the seventh active region and the eighth active region, and forms a channel region of the eighth P-channel field-effect transistor and a channel region of the ninth N-channel field-effect transistor;
a ninth gate electrode that is arranged so as to cross the third active region and the fourth active region, and forms channel of the seventh P-channel field-effect transistor and a channel of the seventh N-channel field-effect transistor;
a tenth gate electrode that is arranged so as to cross the third active region and the fourth active region, and forms a channel region of the tenth P-channel field-effect transistor and a channel region of the tenth N-channel field-effect transistor;
an eleventh gate electrode that is arranged so as to cross the fifth active region and the sixth active region, and forms a channel region of the eleventh P-channel field-effect transistor and a channel region of the eleventh N-channel field-effect transistor; and
a twelfth gate electrode that is arranged so as to cross the fifth active region and the sixth active region, and forms a channel region of the twelfth P-channel field-effect transistor and a channel region of the twelfth N-channel field-effect transistor.

19. The semiconductor integrated circuit according to claim 18, wherein the first, second, and fourth to twelfth gate electrodes are linearly formed, and the third gate electrode is formed into a crank shape.

20. The semiconductor integrated circuit according to claim 19, comprising a wiring that electrically connects the second, fourth, seventh, and twelfth gate electrodes.

* * * * *